US009698144B2

(12) United States Patent
Rodriguez et al.

(10) Patent No.: US 9,698,144 B2
(45) Date of Patent: Jul. 4, 2017

(54) FIELD EFFECT TRANSISTOR HAVING LOOP DISTRIBUTED FIELD EFFECT TRANSISTOR CELLS

(71) Applicant: Raytheon Company, Waltham, MA (US)

(72) Inventors: Istvan Rodriguez, Chelsea, MA (US); Christopher M. Laighton, Boxborough, MA (US); Alan J. Bielunis, Hampstead, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/830,148

(22) Filed: Aug. 19, 2015

(65) Prior Publication Data

US 2017/0053910 A1 Feb. 23, 2017

(51) Int. Cl.
| | | |
|---|---|---|
| *H01L 27/088* | (2006.01) |
| *H01L 23/66* | (2006.01) |
| *H01L 23/48* | (2006.01) |
| *H01L 29/06* | (2006.01) |
| *H01L 29/417* | (2006.01) |
| *H01L 29/423* | (2006.01) |

(52) U.S. Cl.
CPC .......... *H01L 27/088* (2013.01); *H01L 23/481* (2013.01); *H01L 23/66* (2013.01); *H01L 29/0696* (2013.01); *H01L 29/41758* (2013.01); *H01L 29/4238* (2013.01); *H01L 2223/6622* (2013.01); *H01L 2223/6627* (2013.01)

(58) Field of Classification Search
CPC ............... H01L 77/088; H01L 29/0696; H01L 29/41758; H01L 29/4238

USPC ......................................................... 257/393
See application file for complete search history.

(56) References Cited

U.S. PATENT DOCUMENTS

| | | | |
|---|---|---|---|
| 3,969,745 A | 7/1976 | Blocker, III | |
| 4,315,272 A | 2/1982 | Vorhaus | |
| 5,185,534 A | 2/1993 | Sakamoto et al. | |
| 5,376,815 A * | 12/1994 | Yokota ................ | H01L 23/4824 257/327 |
| 5,539,232 A * | 7/1996 | Nakanishi ........... | H01L 23/4824 257/153 |
| 5,736,815 A | 4/1998 | Amemiya | |
| 5,852,318 A * | 12/1998 | Chikamatsu ........ | H01L 29/4175 257/390 |

(Continued)

FOREIGN PATENT DOCUMENTS

DE 26 03 032 A1 8/1977

OTHER PUBLICATIONS

U.S. Appl. No. 14/830,142, filed Aug. 19, 2015, Laighton et al.

(Continued)

*Primary Examiner* — Long K Tran
(74) *Attorney, Agent, or Firm* — Daly, Crowley, Mofford & Durkee, LLP

(57) ABSTRACT

A Field Effect Transistor (FET) having a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads. The FET includes; a gate contact connected to the gate electrode of each one of the FET cells; a drain contact connected to the drain pad of each one of the FET cells; and a source contact connected to source pad of each one of the FET cells. The cells are disposed in a loop configuration.

24 Claims, 9 Drawing Sheets

(56) References Cited

U.S. PATENT DOCUMENTS

| | | | | |
|---|---|---|---|---|
| 6,140,687 | A | * | 10/2000 | Shimomura ........ H01L 23/4824 257/390 |
| 6,285,269 | B1 | | 9/2001 | Ishikawa et al. |
| 6,576,936 | B1 | * | 6/2003 | Bauer ................ H01L 23/4824 257/133 |
| 2004/0245569 | A1 | | 12/2004 | Kowalski |
| 2006/0273407 | A1 | | 12/2006 | Iwata |
| 2012/0086082 | A1 | | 4/2012 | Malinge |
| 2014/0175514 | A1 | | 6/2014 | Darwish et al. |
| 2014/0286097 | A1 | | 9/2014 | Lue |
| 2015/0054034 | A1 | | 2/2015 | Chiu et al. |
| 2015/0194429 | A1 | | 7/2015 | Moroz |

OTHER PUBLICATIONS

U.S. Appl. No. 14/830,142 Response to Office Action filed Aug. 15, 2016.

Notice of Allowance and Issue Fee Due, U.S. Appl. No. 14/830,142, 12 pages.

PCT Notification of Transmittal of International Search Report and the Written Opinion of the International Searching Authority, or the Declaration, PCT/US2016/046105; Oct. 24, 2016, 1 page.

PCT International Search Report, PCT/US2016/046105; Oct. 24, 2016, 4 pages.

PCT Written Opinion of the ISA, PCT/US2016/046105; Oct. 24, 2016, 6 pages.

Invitation to Pay Additional Fees and, Where Applicable, Protest Fees, PCT/US2016/046106, dated Oct. 24, 2016, 7 pages.

Notification of Transmittal of the International Search Report and the Written Opinion of the International Searching Authority, or the Declaration, PCT/US2016/046106, dated Dec. 20, 2016, 1 page.

International Search Report, PCT/US2016/046106, dated Dec. 20, 2016, 6 pages.

Written Opinion of the International Searching Authority, PCT/US2016/046106 dated Dec. 20, 2016, 9 pages.

* cited by examiner

FIELD EFFECT TRANSISTOR HAVING LOOP DISTRIBUTED FIELD EFFECT TRANSISTOR CELLS

TECHNICAL FIELD

This disclosure relates generally to Field Effect Transistors (FETs) and more particularly to improved layouts for such FETs.

BACKGROUND

As is known in the art, a Field Effect Transistor (FET) having a linear array of a 10 plurality of FET cells are used in many applications. Each one of the FET cells has a source, a drain and a gate between the source and the drain to control a flow of carriers along a channel between the source and drain. It should also be understood the source and drain may be reversed in any electrical circuit application; with, in either circuit application, the gate controlling the flow of carriers between a source and a drain.

As is also known in the art, in some FETs, the gates are finger-like gates interconnected to a common gate contact on the top surface of a substrate. Likewise, the individual drains connected to a common drain contact electrode and the sources are connected to a common source contact using air bridges over the gate fingers and over either the drains, or over the sources, and with air bridges connected to a common drain, or source, contact on the bottom surface of the substrate. A FET with the air bridges over the drains is shown in FIG. 1. Generally, many of these are FET cells are stacked together in a linear array in the output stage of a power amp Monolithic Microwave Integrated Circuit (MMIC), as shown in FIG. 1. The linear stacking of these FET cells determines the linear dimension size of the MMIC.

SUMMARY

In accordance with the present disclosure, a Field Effect Transistor (FET) is provided having: a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads; a drain contact connected to the drain pad of each one of the FET cells; and a source contact connected to source pad of each one of the FET cells. The cells are disposed in a loop configuration.

In one embodiment, the FET gate contact is disposed on a bottom surface of the substrate and an electrically conductive gate via passes through the substrate to electrically connect the gate contact to the gate pad.

In one embodiment, the gate pad is disposed in an inner region of the loop.

In one embodiment, the gate projects outwardly from the gate pad.

In one embodiment, the drain contact is disposed on the upper surface of the substrate.

In one embodiment, the source contact is a conductor disposed on the bottom surface of the substrate and is connected to the source pad of each one of the FET cells though a corresponding one of a plurality of electrically conductive source vias passing through the substrate.

In one embodiment, a strip conductor is disposed on the bottom of the substrate, the feed line having one end connected to the gate contact, the feed line being spaced from the conductor disposed on the bottom surface of the substrate and connected to the gate contact through a gate via passing through the substrate.

In one embodiment, the strip conductor and the conductor disposed on the bottom surface of the substrate provide a coplanar waveguide transmission line In one embodiment, the gate via and the plurality of source vias provide a quasi-coaxial transmission line.

In one embodiment, the loop configuration is a circle.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
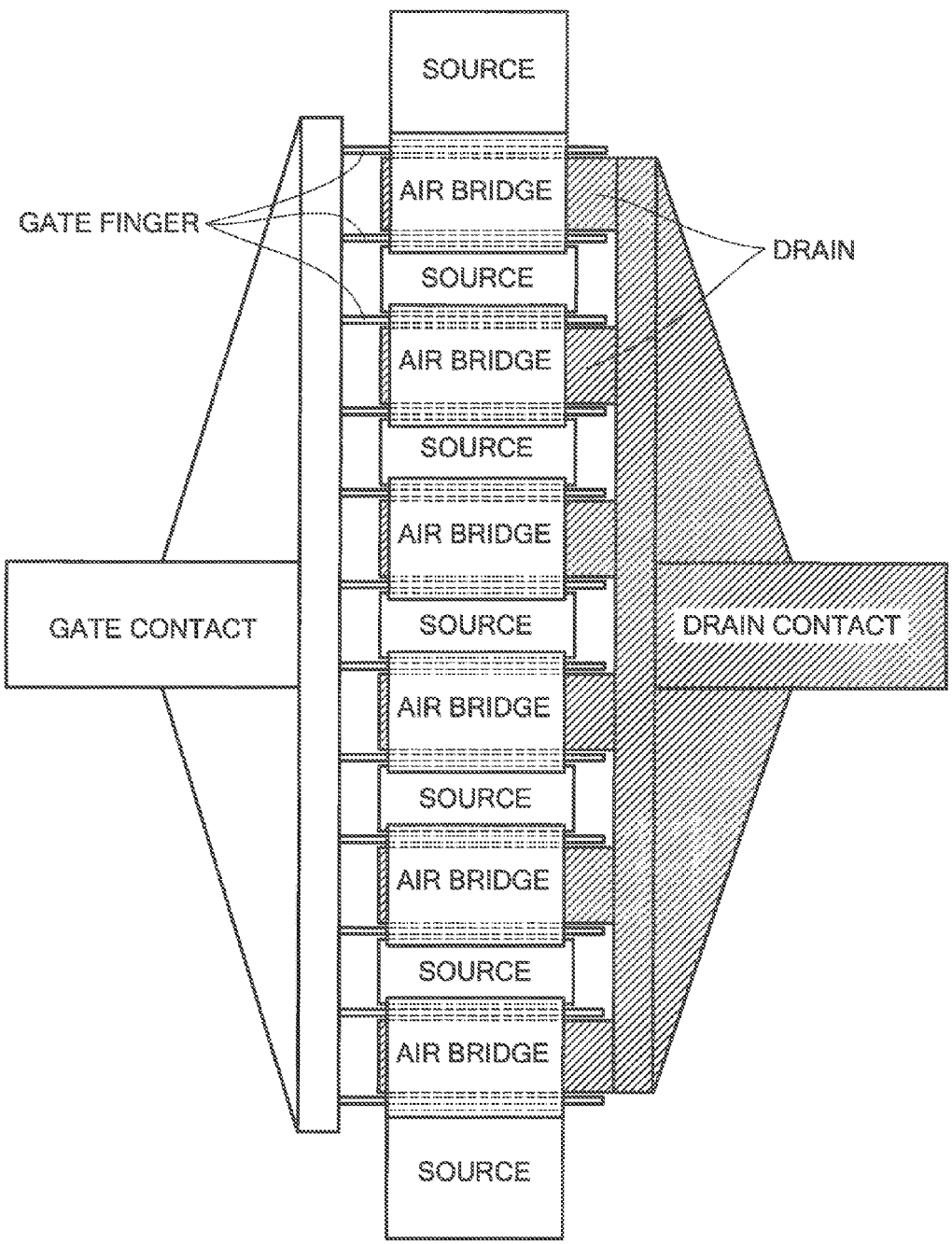
FIG. 1 is a plan view of a Field Effect Transistor (FET) having a plurality of interconnected FET cells according to the PRIOR ART.
Figure 2:
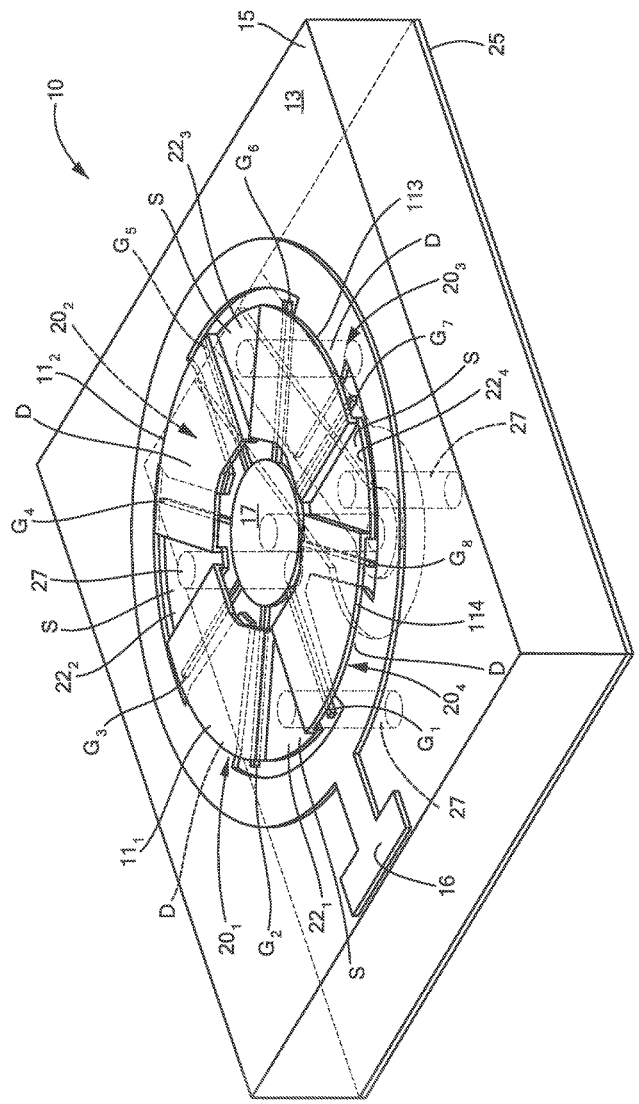
FIG. 2 is a perspective view of a Field Effect Transistor (FET) having a plurality of interconnected FET cells according to the disclosure.
Figure 3A:
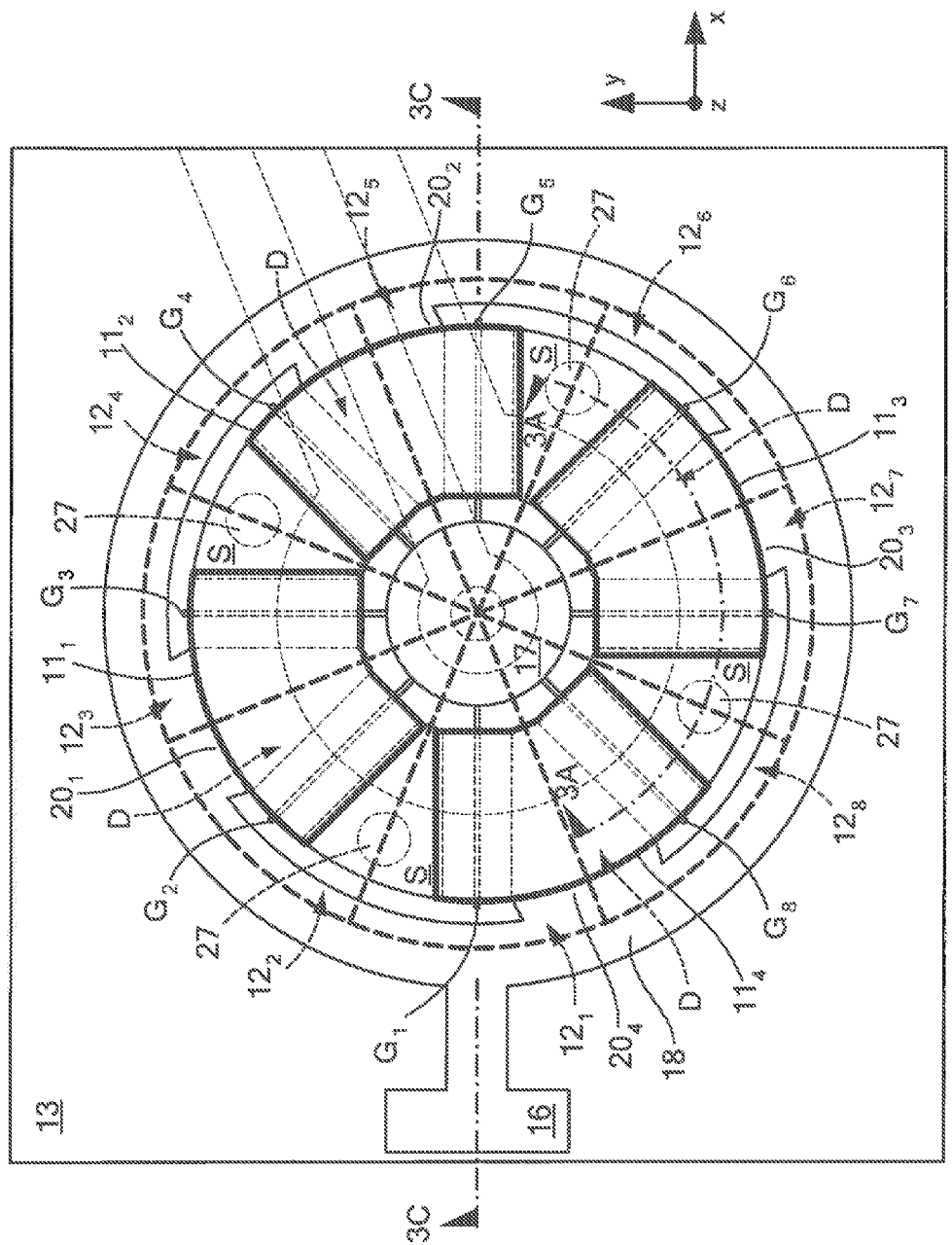
FIG. 3A is a plan view of the FET of FIG. 2.
Figure 3B:
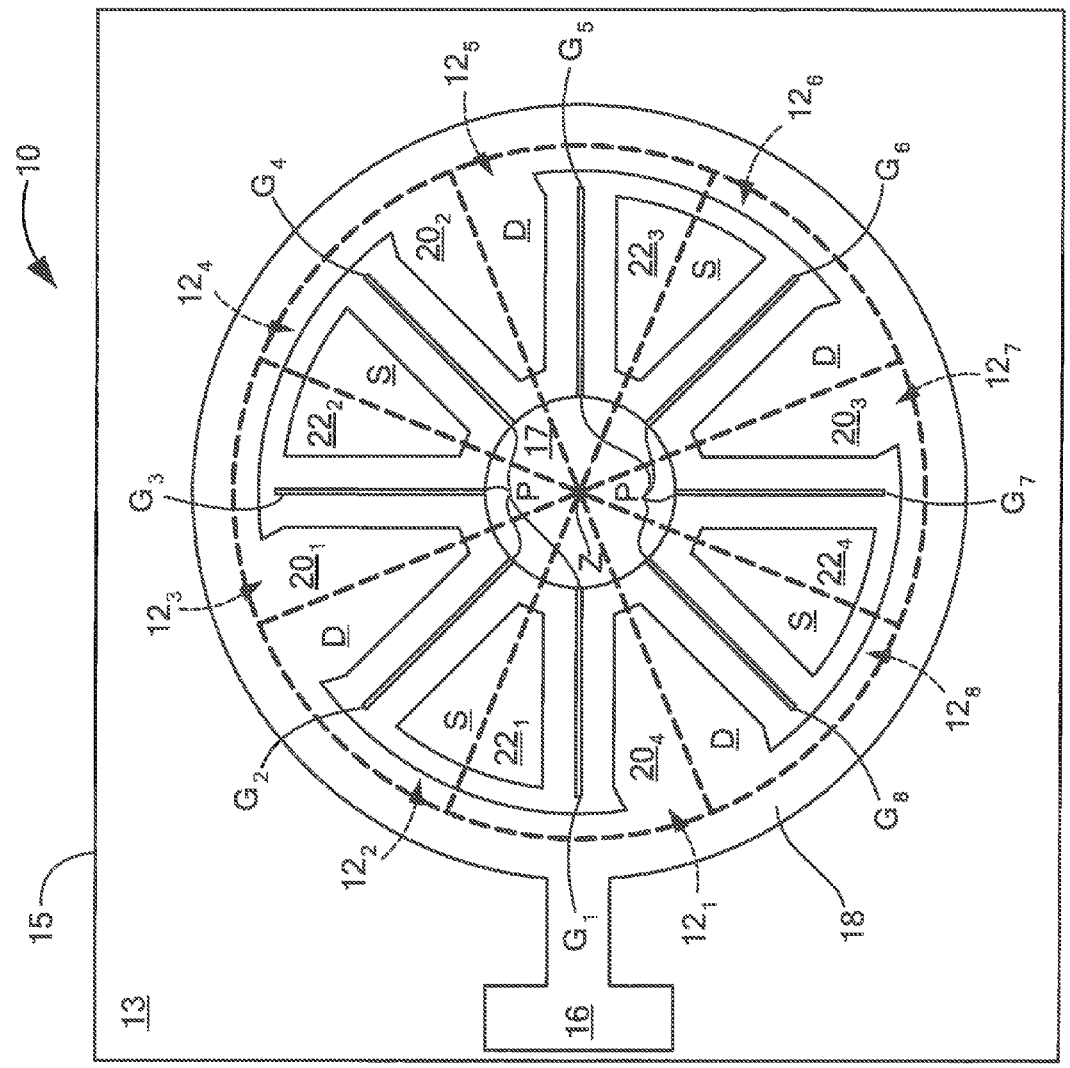
FIG. 3B is a plan view of the FET of FIG. 3A with air bridges used in the FET of FIG. 2 removed to more clearly show elements of the FET of FIG. 2 covered by the air bridges.
Figure 3C:
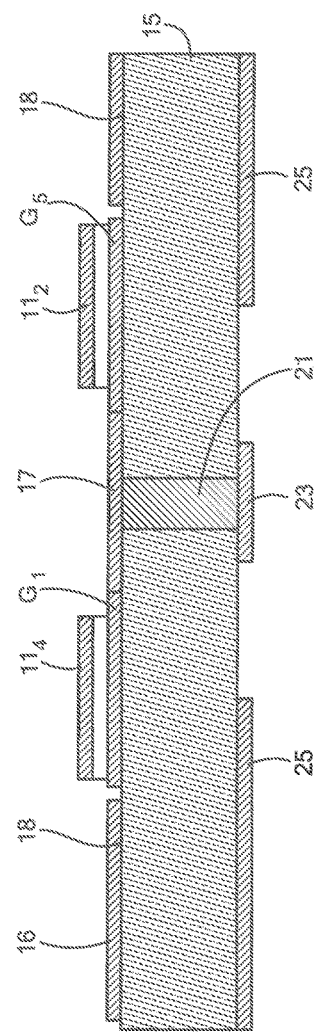
FIG. 3C is a cross sectional view of a portion of the FET of FIG. 2, such cross section being taken along line 3C-3C of FIG. 3A.
Figure 3D:
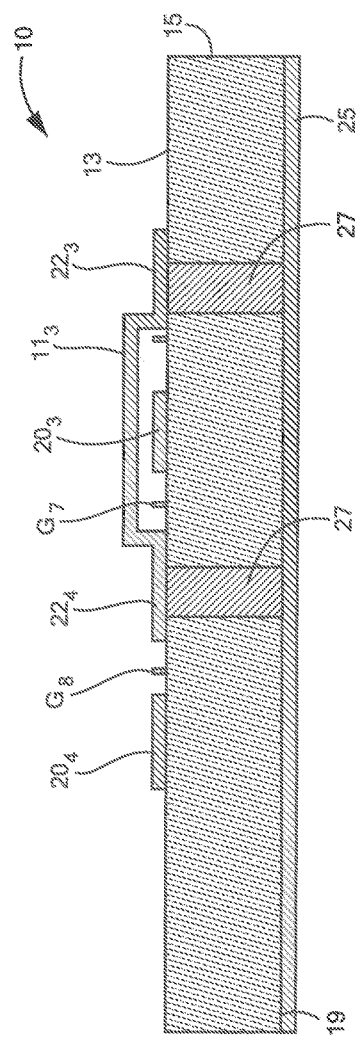
FIG. 3D is a cross sectional view of a portion of the FET of FIG. 2, such cross section being taken along line 3C-3C of FIG. 3A.
Figure 4:
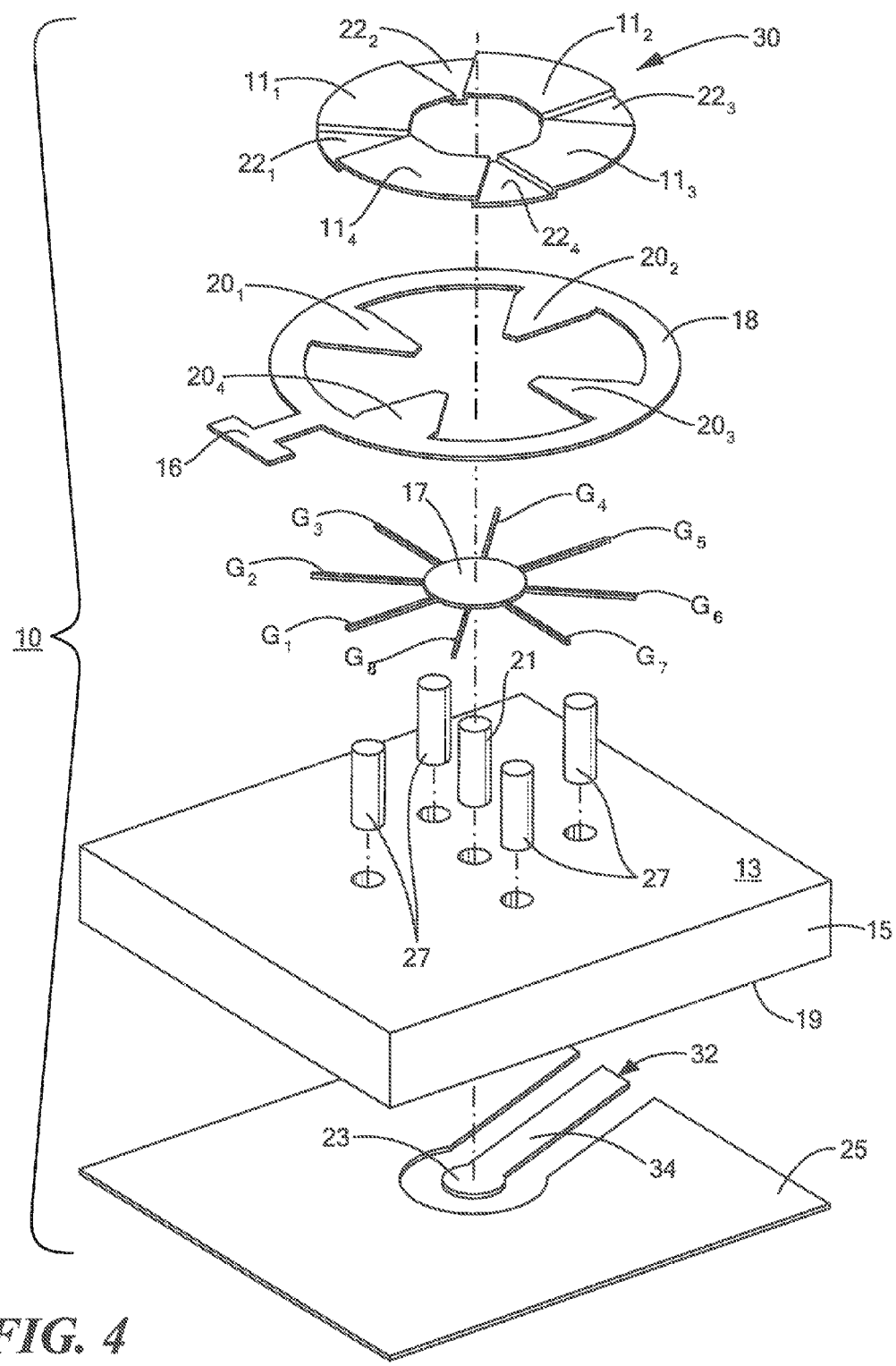
FIG. 4 is an exploded perspective view of the FET of FIG. 2.

Referring now to FIGS. 2, 3A, 3B, 3C, 3D and 4, a Field Effect Transistor (FET) 10 is shown here formed using photo-lithographic chemical etching processing. More particularly, the FET 10 includes a plurality of, here eight, FET cells $12_1$-$12_8$, (FIG. 3A) interconnected by eight air bridges $11_1$-$11_8$ and controlled by a corresponding one of eight gates $G_1$-$G_8$, respectively (FIGS. 2 and 3A; FIG. 3B showing the FET 10 with the air bridges $11_1$-$11_8$ removed to more clearly show the cells $12_1$-$12_8$). Each one of the FET cells $12_1$-$12_8$ has, on an upper, planar surface 13 of a semiconductor substrate 15, here for example a substrate having gallium nitride (GaN), a corresponding one of eight gates $G_1$-$G_8$, respectively, in Schottky contact with the surface 13 of the semiconductor substrate 15, as shown in FIG. 1; each one of the eight gates $G_1$-$G_8$ being disposed between a source (S) and a drain (D) in a manner to be described in more detail hereinafter to control a flow of carriers along a channel between the source pad (S) and drain pad (D) of each one of the eight, FET cells $12_1$-$12_8$. Suffice it to say here; however that each one of the gates $G_1$-$G_8$ is here an elongated, finger-like gate and extends radially outward from a central, circular shaped gate pad 17, as shown. The gate pad 17 is electrically connected to a gate contact 18, shown more clearly in FIG. 4) disposed on a bottom surface 19 (FIG. 2B) of the semiconductor substrate 17 through an electrically conductive gate via 21 disposed at the center of the gate pad 17 and passing vertically through the substrate 15 between the gate pad 17 and the gate contact 23 (FIGS. 3C and 4). The elongated, finger-like gates $G_1$-$G_8$ are regularly spaced about the outer periphery of the common gate pad 17. More particularly, the finger-like gate electrodes $G_1$-$G_8$ are electrically interconnected to successive, evenly spaced points, P, (FIG. 3B) along an outer edge of the common, circular shaped, gate pad 17. Thus, the here eight elongated, finger-like gates $G_1$-$G_8$ are separated one from the other by here forty-five degrees.

The FET 10 also includes a drain contact 16 disposed on the upper surface 13 of the substrate 15 and terminating in a circular ring-like structure 18 (FIG. 4) having a plurality of, here four, radially inwardly extending projections $20_1$-$20_4$ regularly spaced about an outer, circumferential rim of the circular structure 18; each one of the projections $20_1$-$20_4$ is a drain pad in ohmic contacted with the surface 13 of the semiconductor substrate 15. Each one of the projections $20_1$-$20_8$ provides a drain (D) (FIGS. 2, 3A, 3B) for a pair of adjacent FET cells $12_1$-$12_8$, in a manner to be described in more detail hereinafter. The central axis of the circular structure 18 and the center of the circular, common pad 17 are co-axial and are disposed along a common vertical Z axis, such Z axis being perpendicular to the X-Y planar surface 13 (FIG. 3B). Thus, here the surface 13 is in the X-Y plane and the common vertical axis is along the Z-axis. Thus, here the projections $20_1$-$20_4$ are spaced one from another by ninety degrees. It is noted that the projections $20_1$-$20_4$ terminate a predetermined distance from the outer periphery of the common gate pad 17 (FIG. 3B). It is also noted that each one of the projections $20_1$-$20_4$ is disposed between every other adjacent pair of the finger-like gates $G_1$-$G_8$; as shown most clearly in FIG. 3B. Thus, each one of the projections $20_1$-$20_4$ provides two drains (D) for the FET 10, one radial positioned side region of the projection $20_1$-$20_4$ providing a drain for one of the eight FET cells $12_1$-$12_8$ and the opposite radially positioned side region providing a drain for the adjacent one of the eight FET cells $12_1$-$12_8$. Thus, here, projection $20_1$ is disposed between gates $G_2$ and $G_3$; projection $20_2$ is disposed between gates $G_4$ and $G_5$; projection $20_3$ is disposed between gates $G_6$ and $G_7$; and projection $20_4$ is disposed between gates $G_8$ and $G_1$. More particularly, looking vertically downward on the FET 10 and progressing clockwise; one side region of projection $20_1$ provides the drain for FET cell $12_2$ while the opposite side region of projection $20_1$ provides the drain for FET cell $12_3$; one side region of projection $20_2$ provides the drain for FET cell $12_4$ while the opposite side region of projection $20_1$ provides the drain for FET cell $12_5$; one side region of projection $20_3$ provides the drain for FET cell $12_6$ while the opposite side region of projection $20_3$ provides the drain for FET cell $12_7$; and one side region of projection $20_4$ provides the drain for FET cell $18_2$ while the opposite side region of projection $20_4$ provides the drain for FET cell $12_1$.

An annular structure 30 (FIG. 4) having a center coaxial with both the gate pad 17 and the circular ring-like structure 18 (along the Z-axis) has four source pads $22_1$-$22_4$ (FIGS. 2, 3A and 3B) regularly spaced circumferentially about the annular structure 30; that is the source pads $22_1$-$22_4$ are spaced one from the other by ninety degrees and are disposed on the upper surface 13 (FIGS. 2, 3A and 3B). Each one of the source pads $22_1$-$22_4$ is in ohmic contacted with the surface 13 of the semiconductor substrate 15. The source pads $22_1$-$22_4$ (FIG. 4) are electrically interconnected by the air bridges $11_1$-$11_4$ (FIGS. 2, 3A and 4; the air bridges $11_1$-$11_4$ not being shown in FIG. 3B as mentioned above). Thus, the each one of the air bridges $11_1$-$11_4$ is elevated from the surface 13 and, more particularly, each one of the air bridges $11_1$-$11_4$ is elevated from a corresponding one of the projections $20_1$-$20_4$ and over a pair of adjacent $G_1$-$G_8$ on each side of the such corresponding one of the projections; one gate finger on either side of the projection $20_1$-$20_4$. Thus, air bridge $11_1$ is over projection $20_1$ and over gate fingers $G_2$ and $G_3$; air bridge $11_2$ is over projection $20_2$ and over gate fingers $G_4$ and $G_5$; air bridge $11_3$ is over projection $20_3$ and over gate fingers $G_6$ and $G_7$; and air bridge $11_4$ is over projection $20_4$ and over gate fingers $G_8$ and $G_1$; as indicated in FIGS. 2 and 3B. Thus, it is noted that each one of the four source pads $22_1$-$22_4$ is disposed between an adjacent pair of the finger-like gates $G_1$-$G_8$. Thus, source pad $22_1$ is disposed between gates $G_1$ and $G_2$; source pad $22_2$ is disposed between gates $G_3$ and $G_4$; source pad $22_3$ is disposed between gates $G_5$ and $G_6$; and source pad $22_4$ is disposed between gates $G_7$ and $G_8$ as shown in FIG. 3B. Thus, each one of the source pads $22_1$-$22_4$ provides two sources (S) for the FET 10, one radial positioned side region of the source pad $22_1$-$22_4$ providing a source (S) for one of the eight FET cells $12_1$-$12_8$ and the opposite radially positioned side region providing a source (S) for the adjacent one of the eight FET cells $12_1$-$12_8$. Thus, each one of the gate fingers $G_1$-$G_8$ is disposed between a source (S) and drain (D), with each one of the fingers $G_1$-$G_8$ being adjacent one side of one of the source (S) and one side of the drain (D) while an adjacent one of the gate fingers $G_1$-$G_8$ is adjacent the other side of the same drain (D) and one of the source (S). It follows then that each gate finger (G) shares a drain (D) provided by one of the projections or drain pads $20_1$-$20_4$ and a source (S) provided by an adjacent one of the source pads $22_1$-$22_4$.

Referring again to FIG. 4, a source contact 25, here provided by an electrical conductor 25 on the bottom surface 19 of the substrate 17 is electrically connected to the sources pads $22_1$-$22_4$ of the FET cells $12_1$-$14_8$ through, here four vias 27 (FIGS. 2, 3A, and 4) passing vertically through the substrate 15 between the conductor 25 and the four source pads $22_1$-$22_4$. Also formed on the bottom surface 19 of the substrate 15 is a conductive feed 32 (FIG. 4) for the gate pad 17. The feed 32 is a strip conductor 34 terminating in the gate contact 23. The gate contact 23 is connected to the gate pad 17 with a gate via 21. It is noted that the gate via 21 is disposed within a circular array of the vias 27 thus forming a vertical quasi coaxial transmission line. It is also noted that the electrical conductor 25 (FIG. 4) and feed 32 are electrically insulated from each other by the portion of the substrate 19 in the space between the feed 32 and the electrical conductor 25, as indicated. Thus, the conductor 25 on the bottom of the substrate 15 is spaced a predetermined distance from the feed line 34, as indicated, to provide a coplanar waveguide (CPW) transmission line feed for the 32. Thus, an RF input signal is fed to the FET 10 through the backside in a quasi-coax approach.

Thus, the FET cells $12_1$-$12_8$ are disposed in an X-Y plane in a closed loop configuration, here for example, a circular configuration in the X-Y plane (FIGS. 3A and 3B) on the upper surface 13 of the substrate 19. The FET 10 is suitable for flip chip mounting to a printed circuit board.

Figure 5:
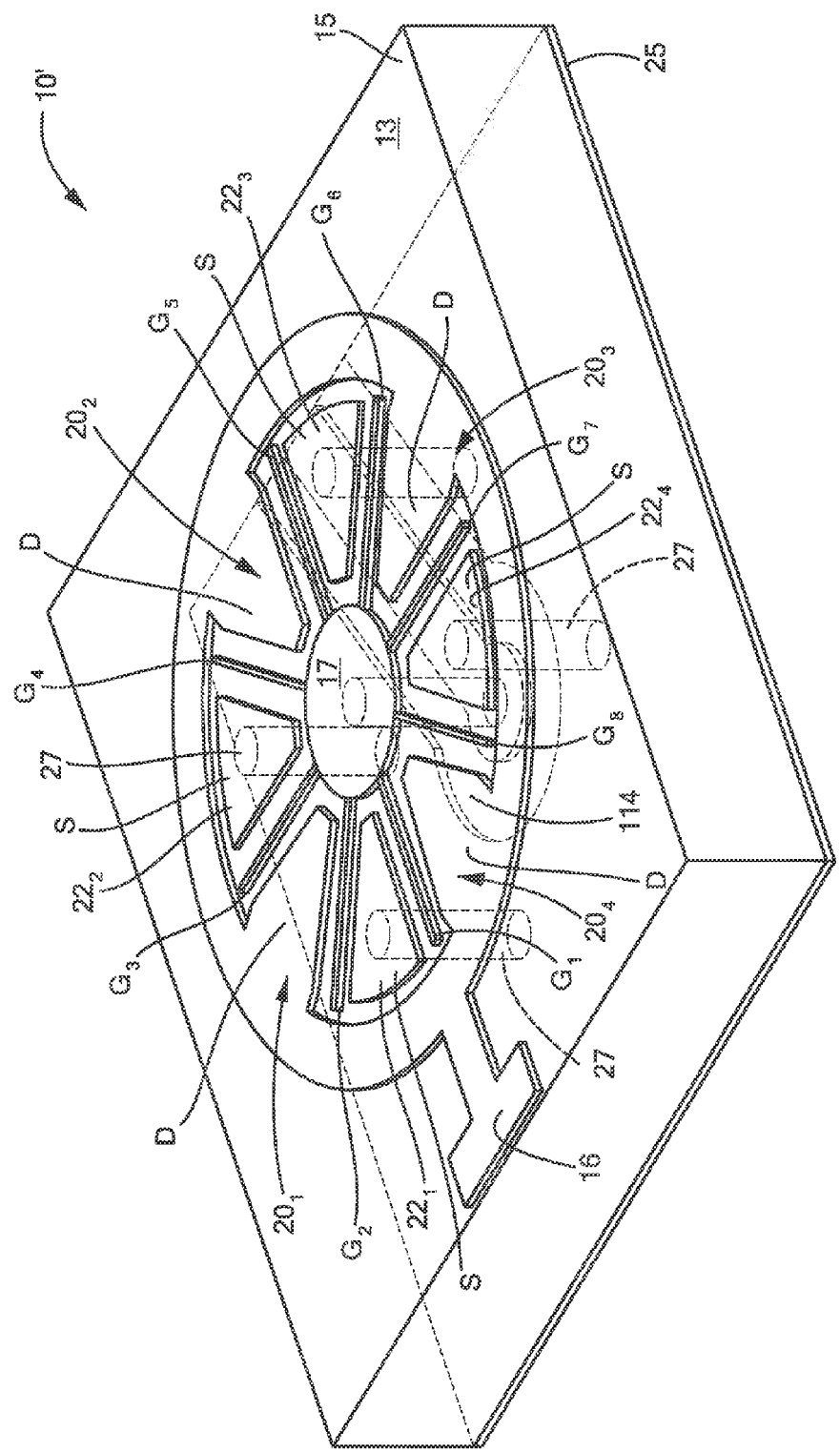
FIG. 5 is a perspective view of a FET having a plurality of interconnected FET cells according to another embodiment of the disclosure.

Referring now to FIG. 5, here the FET 10' has the air bridges $11_1$-$11_4$ eliminated since each one of the source pads $22_1$-$22_4$ is connected to ground conductor 25 of the bottom of the substrate 15 with the vias 27. More particularly, it was recognized that because the gates G1-G8 extend radially out from the pad 17, the source pads $22_1$-$22_4$ are triangular shaped and thus flare out from the center of the pad 17, there is now sufficient space towards the base of the triangle for placement of a via 27 thus eliminating the need for air bridges. To put it another way, the gate to gate spacing spreads out as one moves away from the center of the FET which allows for vias 27 for each source pad without growing the size of the FET.

Thus, here the FET 10' again includes the plurality of, here eight, FET cells $12_1$-$12_8$, (FIG. 3A); here, however they are interconnected by the electrical conductor 25 through the vias 27. More particularly, as described above and shown more clearly in FIG. 3B, one side region of projection $20_1$ provides the drain for FET cell $12_2$ while the opposite side region of projection $20_1$ provides the drain for FET cell $12_3$; one side region of projection $20_2$ provides the drain for FET cell $12_4$ while the opposite side region of projection $20_1$ provides the drain for FET cell $12_5$; one side region of projection $20_3$ provides the drain for FET cell $12_6$ while the opposite side region of projection $20_3$ provides the drain for FET cell $12_7$; and one side region of projection $20_4$ provides the drain for FET cell $18_2$ while the opposite side region of projection $20_4$ provides the drain for FET cell $12_1$.

Figure 5A:
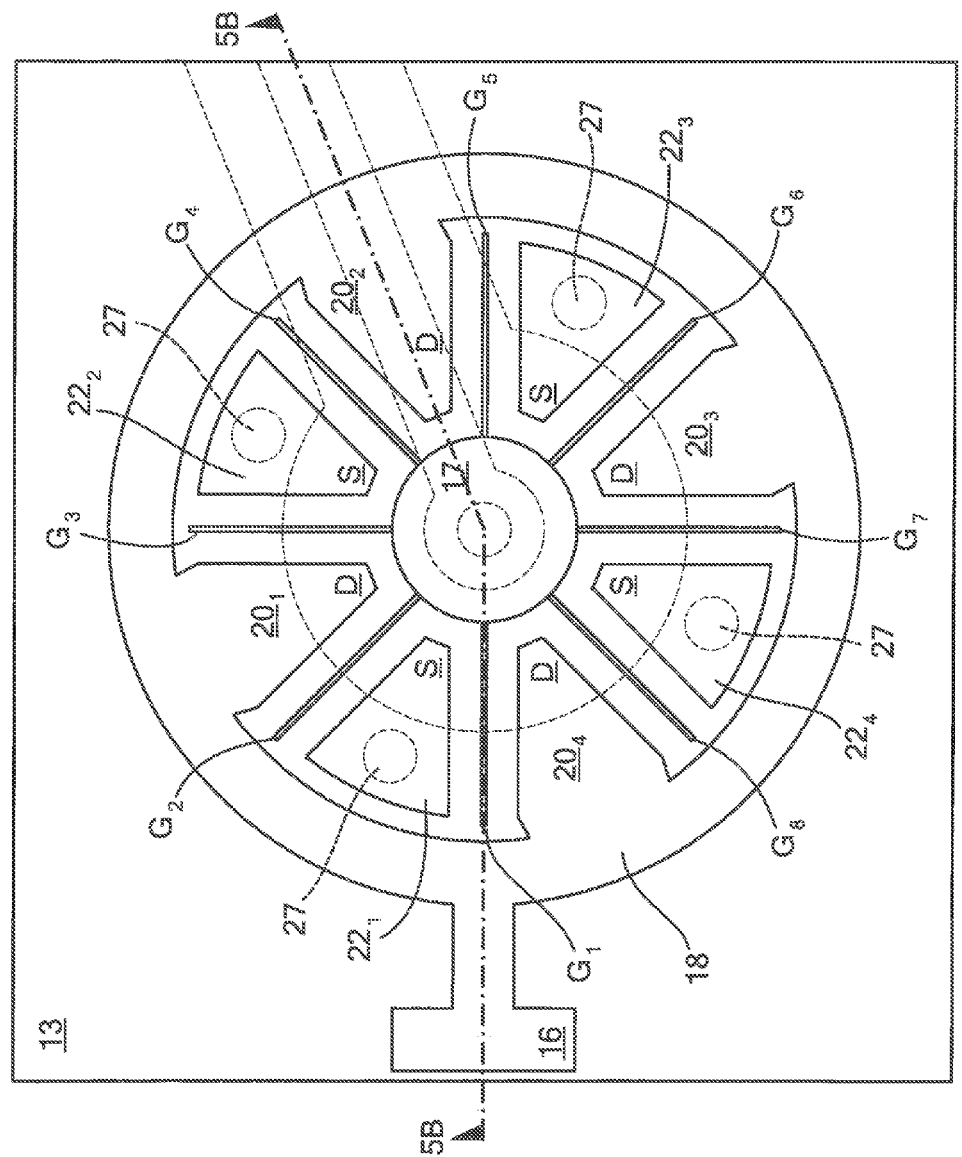
FIG. 5A is a plane view of the FET of FIG. 5.
Figure 5B:
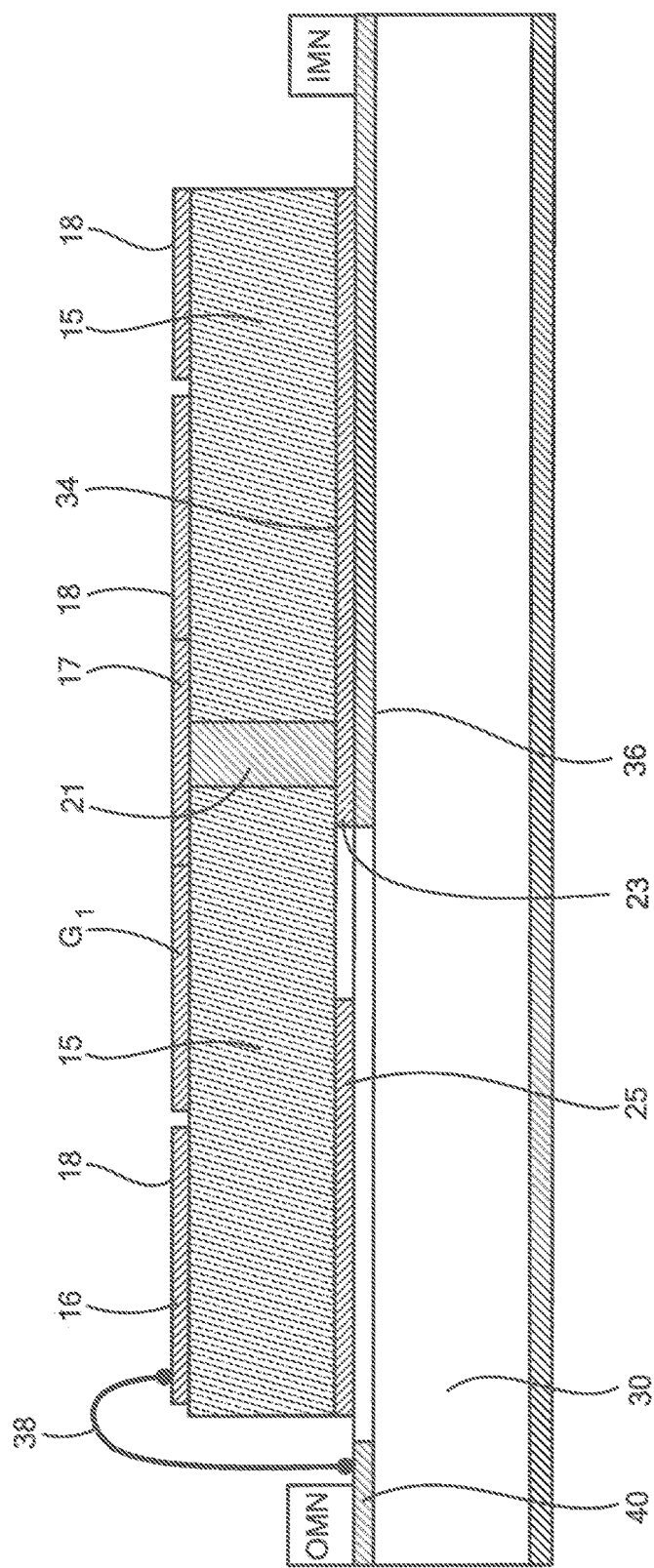
FIG. 5B is a cross sectional view of the FET of FIG. 5, such cross section being taken along line 5B-5B of FIG. 5A with the FET mounted to a printed circuit board having an input impedance matching network (IMN) and an output impedance matching network (OMN) coupled to the FET.

The drain/RF output can be bonded to from the topside of this circular FET as shown in FIG. 5A. Thus, referring to FIG. 5B the FET 10' mounted to a printed circuit board 30 having an input impedance matching network (IMN) and an output impedance matching network (OMN) coupled to the FET 10'. More particularly, the IMN is coupled to the gate contact 23 through a microstrip transmission line having a strip conductor 36 separated from a ground plane conductor 38. More particularly, the strip conductor 36 is connected to the strip conductor 34 (FIG. 4). The OMN is coupled to the drain contact 16 through a conductor 38 connecting the strip conductor 40 of a microstrip transmission line separated from an underlying portion of the ground plane conductor 38.

A number of embodiments of the disclosure have been described. Nevertheless, it will be understood that various modifications may be made without departing from the spirit and scope of the disclosure. For example, other loop configurations may be used such as, for example, an oval or square or rectangular or triangular or other polygon shaped configuration. Further, the source and drain may be reversed in any electrical circuit application; with, in either circuit application, the gate controlling the flow of carriers between a source and a drain. Accordingly, other embodiments are within the scope of the following claims.

What is claimed is:

1. A Field Effect Transistor (FET), comprising:
   a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads;
   a gate contact connected to the gate electrode of each one of the FET cells;
   a drain contact connected to the drain pad of each one of the FET cells;
   a source contact connected to source pad of each one of the FET cells;
   wherein the cells are disposed in a loop configuration; and including a gate pad disposed on an upper surface of the substrate connected to the plurality of gate electrodes; wherein the gate contact is disposed on an bottom surface of the substrate; and wherein an electrically conductive gate via passes through the substrate to electrically connect the gate contact to the gate pad.

2. The FET recited in claim 1 including a gate pad disposed on an upper surface of the substrate connected to the plurality of gate electrodes and wherein the gate pad is disposed in the inner region of the region of the loop configuration.

3. The FET recited in claim 2 wherein one of the source contact or the drain contact is disposed on the bottom surface of the substrate.

4. The FET recited in claim 1 wherein the gate pad is disposed in an inner region of the loop configuration.

5. The FET recited in claim 4 wherein the gate electrodes projects outwardly from the gate pad.

6. The FET recited in claim 1 wherein the loop configuration is a circle.

7. The FET recited in claim 6 including: a substrate: and a gate pad disposed on an upper surface of the substrate; wherein the gate contact is disposed on an bottom surface of the substrate; and wherein an electrically conductive gate via passes through the substrate to electrically connect the gate contact to the gate pad.

8. The FET recited in claim 7 wherein the gate pad is disposed at the center of the circle.

9. The FET recited in claim 8 wherein the gate projects outwardly from the gate pad.

10. The FET recited in claim 6 wherein the gate pad is disposed at the center of the circle.

11. The FET recited in claim 10 wherein one of the source contact or the drain contact is disposed on the bottom surface of the substrate.

12. A Field Effect Transistor (FET), comprising:
    a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads;
    a gate contact connected to the gate electrode of each one of the FET cells;
    a drain contact connected to the drain pad of each one of the FET cells;
    a source contact connected to source pad of each one of the FET cells;
    wherein the cells are disposed in a loop configuration;
    wherein the gate pad is disposed in an inner region of the loop configuration; and
    wherein one of the source contact or the drain contact is a conductor disposed on the bottom surface of the substrate and is connected to the corresponding one of the source pad or drain pad of each one of the FET cells through a corresponding one of a plurality of electrically conductive vias passing through the substrate.

13. The FET recited in claim 12 including a strip conductor disposed on the bottom of the substrate, and including a feed line having one end connected to the gate contact through a gate via passing through the substrate, the feed line being spaced from the conductor disposed on the bottom surface of the substrate.

14. The FET recited in claim 12 wherein the strip conductor and the conductor disposed on the bottom surface of the substrate provide a coplanar waveguide transmission line.

15. The FET recited in claim 14 wherein the gate via and the plurality of vias provide a quasi-coaxial transmission line.

16. A Field Effect Transistor (FET), comprising:
a substrate;
a plurality of FET cells having a plurality of source pads, a plurality of drain pads, and a plurality of gate electrodes disposed on a surface of the substrate; each one of the FET cells having a corresponding one of the gate electrodes disposed between one of the source pads and one of the drain pads;
a gate contact connected to the gate electrode of each one of the FET cells;
a drain contact connected to the drain pad of each one of the FET cells;
a source contact connected to source pad of each one of the FET cells;
wherein the cells are disposed in a loop configuration;
wherein the loop configuration is a circle
wherein the gate pad is disposed at the center of the circle;
a gate pad disposed on an upper surface of the substrate; wherein the gate contact is disposed on an bottom surface of the substrate; and wherein an electrically conductive gate via passes through the substrate to electrically connect the gate contact to the gate pad; and
wherein one of the source contact or drain contact is a conductor disposed on the bottom surface of the substrate and is connected to the corresponding source or drain of each one of the FET cells though a corresponding one of a plurality of electrically conductive vias passing through the substrate.

17. The FET recited in claim 16 including a strip conductor disposed on the bottom of the substrate, the feed line having one end connected to the gate contact, the feed line being spaced from the conductor disposed on the bottom surface of the substrate.

18. The FET recited in claim 16 wherein the strip conductor and the conductor disposed on the bottom surface of the substrate provide a coplanar waveguide transmission line.

19. The FET recited in claim 18 wherein the gate via and the plurality of source vias provide a quasi-coaxial transmission line.

20. A Field Effect Transistor (FET), comprising:
a plurality of FET cells disposed in a loop configuration, the plurality of FET cells having a plurality of source pads, a plurality of drain pads, and a plurality of gate electrodes disposed on a surface of a substrate; each one of the FET cells having a corresponding one of the gate electrodes; each one of the plurality of gate electrodes extending along directions outwardly from an inner region of the loop configuration between a corresponding one of the source pads and a corresponding one of the drain pads;
a gate contact connected to the gate electrode of each one of the FET cells;
a drain contact connected to the drain pad of each one of the FET cells; and
a source contact connected to source pad of each one of the FET cells;
a substrate; and
wherein one of the source pads or drain for each one of the FET cells in the plurality of FET cells is connected to a corresponding source or drain contact disposed on a bottom surface of the substrate.

21. A Field Effect Transistor (FET), comprising:
a plurality of FET cells having a plurality of source pads, a plurality of drain pads, and a plurality of gate electrodes disposed on a surface of a substrate; each one of the FET cells having a corresponding one of the gate electrodes disposed between one of the source pads and one of the drain pads;
a gate contact connected to the gate electrodes of each one of the FET cells;
a drain contact connected to the drain pad of each one of the FET cells;
a source contact connected to source pad of each one of the FET cells;
wherein the gate electrode of each one of the plurality of FET cells projects radially outwardly from a center of the FET; and
wherein one of the source pads or drain pads of each one of the FET cells in the plurality of FET cells is connected to a contact on a bottom surface of the substrate through a corresponding one of a plurality of vias passing through the substrate, and wherein each one of the plurality of vias is disposed between a pair of the gates.

22. The FET recited in claim 21 including a strip conductor disposed on the bottom of the substrate, the feed line having one end connected to the gate contact through a gate via passing through the substrate, the feed line being spaced from the conductor disposed on the bottom surface of the substrate.

23. The FET recited in claim 22 wherein the strip conductor and the conductor disposed on the bottom surface of the substrate provide a coplanar waveguide transmission line.

24. The FET recited in claim 23 wherein the gate via and the plurality of vias provide a quasi-coaxial transmission line.

* * * * *